(12) United States Patent
Bauco

(10) Patent No.: US 9,182,561 B2
(45) Date of Patent: Nov. 10, 2015

(54) OPTICAL FIBER CABLE WITH CABLE HEATING ELEMENT

(71) Applicant: Corning Cable Systems LLC, Hickory, NC (US)

(72) Inventor: Anthony Sebastian Bauco, Horseheads, NY (US)

(73) Assignee: Corning Cable Systems LLC, Hickory, NC (US)

(*) Notice: Subject to any disclaimer, the term of this patent is extended or adjusted under 35 U.S.C. 154(b) by 101 days.

(21) Appl. No.: 14/054,094

(22) Filed: Oct. 15, 2013

(65) Prior Publication Data

US 2015/0049992 A1 Feb. 19, 2015

Related U.S. Application Data

(60) Provisional application No. 61/865,344, filed on Aug. 13, 2013.

(51) Int. Cl.
*G02B 6/44* (2006.01)
*G01R 31/308* (2006.01)

(52) U.S. Cl.
CPC ............ *G02B 6/4401* (2013.01); *G01R 31/308* (2013.01); *G02B 6/447* (2013.01); *G02B 6/4416* (2013.01)

(58) Field of Classification Search
CPC ...................................... G02B 6/4496
See application file for complete search history.

(56) References Cited

U.S. PATENT DOCUMENTS

| | | | | |
|---|---|---|---|---|
| 4,412,936 A | * | 11/1983 | Khmelkov et al. | 252/408.1 |
| 6,388,194 B1 | | 5/2002 | Ryeczek | 174/112 |
| 6,456,785 B1 | * | 9/2002 | Evans | 392/488 |
| 6,596,943 B1 | * | 7/2003 | Ward | 174/112 |
| 6,798,956 B2 | * | 9/2004 | Morrison | 385/100 |
| 7,029,137 B2 | * | 4/2006 | Lionetti et al. | 362/84 |
| 7,038,135 B1 | * | 5/2006 | Chan et al. | 174/84 R |
| 7,049,937 B1 | * | 5/2006 | Zweig et al. | 340/657 |
| 7,242,831 B2 | * | 7/2007 | Fee | 385/103 |
| 7,406,231 B1 | * | 7/2008 | Beck et al. | 385/100 |

(Continued)

FOREIGN PATENT DOCUMENTS

| | | | | |
|---|---|---|---|---|
| CN | 200941319 Y | 8/2007 | | H01B 7/36 |
| CN | 102589728 A | 7/2012 | | G01K 1/02 |

(Continued)

OTHER PUBLICATIONS

Patent Cooperation Treaty International Search Report, Application No. PCT/US2014/049524, Jan. 20, 2015, 5 pages.

*Primary Examiner* — Rhonda Peace

(57) ABSTRACT

An optical communication cable is provided. The optical communications cable includes a cable body having a first end, a second end, an outer surface, an inner surface and a channel defined by the inner surface and extending between the first end and the second end. The optical communications cable includes an optical transmission element located in the channel, and a resistive heating element extending at least a portion of the length of the cable body. The resistive heating element defines an electrically conductive path between first and second ends of the resistive heating element. The first and second ends of the resistive heating element are in electrical communication with an exterior of the optical communication cable and are configured to be coupled to a power source that can deliver current to heat the resistive heating element.

14 Claims, 4 Drawing Sheets

(56) References Cited

U.S. PATENT DOCUMENTS

| | | | |
|---|---|---|---|
| 7,524,082 B2 * | 4/2009 | North | 362/219 |
| 7,671,279 B2 * | 3/2010 | Yin | 174/113 R |
| 7,748,860 B2 * | 7/2010 | Brunet | 362/84 |
| 7,920,764 B2 * | 4/2011 | Kewitsch | 385/101 |
| 7,932,805 B2 | 4/2011 | Darr et al. | 337/243 |
| 8,102,169 B2 * | 1/2012 | Law et al. | 324/66 |
| 8,150,227 B2 * | 4/2012 | Kewitsch | 385/101 |
| 8,428,405 B2 * | 4/2013 | Kewitsch | 385/101 |
| 8,896,286 B2 * | 11/2014 | Abuelsaad et al. | 324/66 |
| 8,896,287 B2 * | 11/2014 | Abuelsaad et al. | 324/66 |
| 2002/0185299 A1 * | 12/2002 | Giebel | 174/110 R |
| 2007/0153508 A1 * | 7/2007 | Nall et al. | 362/219 |
| 2008/0121171 A1 | 5/2008 | Hulsey | 116/216 |
| 2008/0198618 A1 * | 8/2008 | North | 362/551 |
| 2008/0273844 A1 * | 11/2008 | Kewitsch | 385/101 |
| 2010/0148747 A1 | 6/2010 | Rathbun, II et al. | 324/66 |
| 2010/0166374 A1 * | 7/2010 | Lapp | 385/101 |
| 2011/0150488 A1 * | 6/2011 | Kewitsch | 398/116 |
| 2012/0219259 A1 * | 8/2012 | Kewitsch | 385/101 |
| 2015/0049992 A1 * | 2/2015 | Bauco | 385/100 |

FOREIGN PATENT DOCUMENTS

| | | | |
|---|---|---|---|
| CN | 202305952 U | 7/2012 | G02B 6/44 |
| EP | 0952589 A2 | 10/1999 | H01B 7/36 |
| JP | 5711305 A | 1/1982 | G02B 5/16 |
| JP | 59182404 A | 10/1984 | G02B 5/16 |
| JP | 2055506 A | 2/1990 | H02G 1/36 |
| KR | 875507 B1 | 12/2008 | H01B 7/36 |
| WO | WO0011484 | 3/2000 | G01R 31/08 |

* cited by examiner

OPTICAL FIBER CABLE WITH CABLE HEATING ELEMENT

CROSS-REFERENCE TO RELATED APPLICATIONS

This application claims the benefit of priority under 35 U.S.C. §119 of U.S. Provisional Application Ser. No. 61/865,344, filed on Aug. 13, 2013, the content of which is relied upon and incorporated herein by reference in its entirety.

BACKGROUND

The disclosure relates generally to cables and more particularly to optical communication cables including a heating element configured to raise the temperature of the outer surface of the cable. The disclosure also relates to methods of tracing the path of such an optical communication cable within a group of cables.

Optical communication cables have seen increased use in a wide variety of electronics and telecommunications fields. Fiber optic cable assemblies may range in size and complexity from single-fiber jumpers to multi-fiber harnesses. These cable assemblies are typically used to interconnect equipment in high-speed networks, and within some high-speed networks, a large number of multiple individual cables (e.g., fiber optic patch cords) are used to interconnect various equipment, for example, within a telecommunications closet, server room, etc. As the needs of the network change or as repairs are needed, network operators frequently desire to change, move or replace cables with the network.

SUMMARY

One embodiment of the disclosure relates to an optical communication cable. The optical communication cable includes a cable body having a first end, a second end, an outer surface, an inner surface, and a channel defined by the inner surface and extending between the first end and the second end. The optical communication cable also includes an optical transmission element located in the channel and heating means for receiving an electrical current and increasing the temperature of the optical communication cable. The heating means extends along at least a portion of the length of the cable body. Various heating means are disclosed.

In another embodiment, an optical communication cable includes a cable body having a first end, a second end, an outer surface, an inner surface, and a channel defined by the inner surface and extending between the first end and the second end. The optical communication cable also includes an optical transmission element located in the channel and a resistive heating element extending at least a portion of the length of the cable body. The resistive heating element defines an electrically conductive path between first and second ends of the resistive heating element. The first and second ends of the resistive heating element are in electrical communication with an exterior of the optical communication cable and are configured to be coupled to a power source to deliver current to heat the resistive heating element.

An additional embodiment of the disclosure relates to a communication cable including a cable body. The cable body includes a first end, a second end, an outer surface, an inner surface, and a channel defined by the inner surface and extending between the first end and the second end. The communication cable includes a data transmission element located in the channel and a resistive heating element extending the length of the cable body. The resistive heating element defines an electrically conductive path between first and second ends of the resistive heating element. The first and second ends of the resistive heating element are in electrical communication with an exterior of the communication cable and are configured to be coupled to a power source to deliver current to heat the resistive heating element.

An additional embodiment of the disclosure relates to a method of tracing the path of a first cable within a group of cables. The method includes the step of increasing the temperature of an outer surface of the first cable along substantially the entire length of the first cable. The method includes detecting the increased temperature of the outer surface of the first cable.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding and are incorporated in and constitute a part of this specification. The drawings illustrate one or more embodiment(s), and together with the description serve to explain principles and operation of the various embodiments.

DETAILED DESCRIPTION

Figure 1:
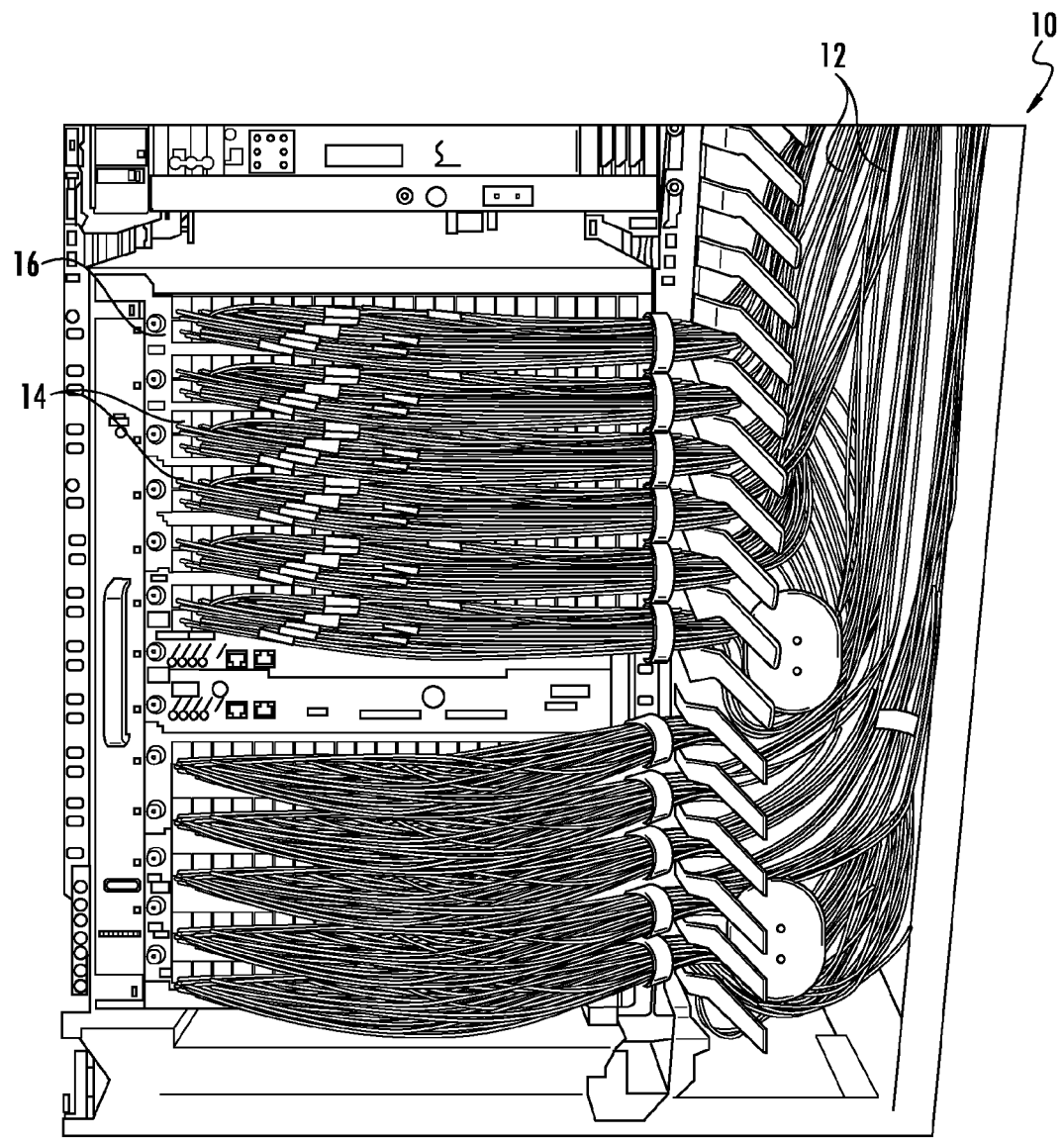
FIG. 1 is a perspective view of an equipment rack supporting fiber optic cables.

Referring generally to the figures, various embodiments of a cable, e.g., an optical communication cable, including a heating element are shown. In various embodiments, the heating element is a resistive heating element that is located within the cable and runs substantially the entire length of the cable. The resistive heating element when coupled to a power source (e.g., a voltage source, current source, etc.) generates heat along the length of the cable. The heating allows a user, e.g., a network operator, to use the increased temperature of the cable to identify a particular cable within groups or bundles of cables typical within many network installations. Because the heating element runs substantially the entire length of the cable, the increased temperature allows the entire length of the cable to be identified from the other cables within a group of cables allowing the network operator to more easily remove, repair, untangle, disconnect, etc. a particular cable from all of the other cables within the group.

In various embodiments, an infrared detection device (e.g., infrared camera, infrared goggles, etc.) may be used to allow the network operator to view the cable with increased temperature generated by the energized resistive heating element. In some embodiments, the material of the cable may include a thermochromic material that produces a visible color change as the resistive heating element increases the temperature of a particular cable, and in such embodiments use of an infrared detection device may not be needed.

In various embodiments, the resistive heating elements are structured and arranged within the cable to provide heating sufficient to be detected but not jeopardize the integrity of the material of the body of the cable. In addition, in some embodiments, the arrangement and configuration of the resistive heating element allows for heating along the length of the cable while avoiding or limiting preferential bending that may be caused by a structure embedded within the body of the cable. Further, in contrast to some structures typically found within optical cable constructions, the resistive heating elements discussed herein are configured to provide a contiguous current path between ends of the cable and to also provide ends of the resistive heating element in some embodiments is in electrical communication with the exterior of the cable to allow the coupling of a voltage source to the resistive heating element from the outside of the cable.

In many network environments, large numbers of cables are interconnected to a variety of communications or electronic equipment resulting in congestion that can make tracing the length of a particular cable difficult. In some network environments, cables (e.g., fiber optic patch cords) may be relatively long (e.g., between about 6 feet and 90 feet in length) such that identifying the ends and the length of a particular cable to be moved or replaced may be a labor intensive task typically involving two workers incrementally and manually tracing a particular cable from one end to the other. Thus, the cable embodiments of the present disclosure provide systems and methods that allow the identification of both ends of a cable and/or to also trace the length of the cable.

Figure 2:
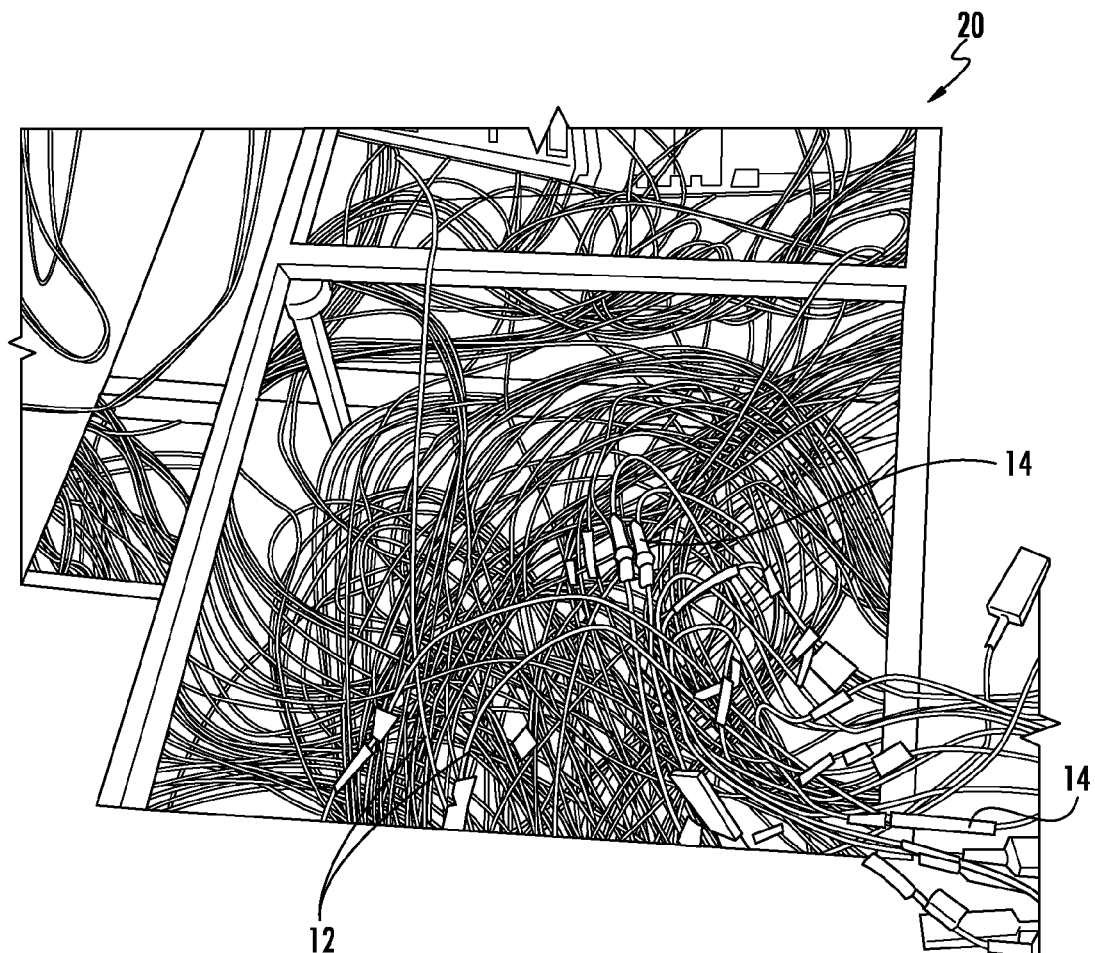
FIG. 2 is a perspective view of an under-floor cable tray supporting fiber optic cables.

FIG. 1 shows an equipment rack 10, and a large number of cables, shown as fiber optic cables 12. FIG. 2 shows bundles of fiber optic cables 12 located in an under-floor cable tray 20. In both FIG. 1 and FIG. 2, fiber optic cables 12 include connectors 14 located at the ends of the cables. In FIG. 1, connectors 14 are shown attached to hardware, such as servers 16 supported by equipment rack 10, and in FIG. 2, connectors 14 are shown interconnecting cables 12 with other fiber optic cables. Fiber optic cables 12 may be legs of larger cable assemblies, such as harness cable assemblies or jumper cables extending from a furcation body coupled to a trunk cable. In other embodiments, cables 12 may be patch cords, e.g., fiber optic cables including an optical fiber, a cable body, and connectors on each end of the cable, to interconnect equipment within a network installation.

As can be seen in the exemplary network environments of FIG. 1 and FIG. 2, cables 12 can become congested making identification of the ends and the length of a particular fiber optic cable 12 difficult. The network operator may need to identify a particular optical fiber for a number of reasons, such as to replace a broken or malfunctioning cable, to move or add cables to accommodate changes in the network, to install new hardware, etc. Such identification may be particularly difficult in fiber optic network installations because of the relatively small diameter of the typical fiber optic cable (e.g., a typical fiber optic patch cord may have an outer diameter of about 2 mm).

Accordingly, to facilitate such activities, the cable embodiments discussed herein include a heating element that allows for identification of both ends of a particular cable as well as the length of the cable body. In particular, the heating element is configured to increase the temperature of a selected cable 12 within the group of cables, and the increased temperature is detected (e.g., via infrared imaging, thermochromic pigments, etc.) allowing the user to identify the selected cable 12. It should be understood that while the embodiments discussed herein relate primarily to fiber optic cables, in other embodiments, the heating element and cable identification methods discussed herein can be applied to other types of cables or conduits, such electrical-communication wires, power lines, hydraulic-fluid lines, etc.

Figure 3:
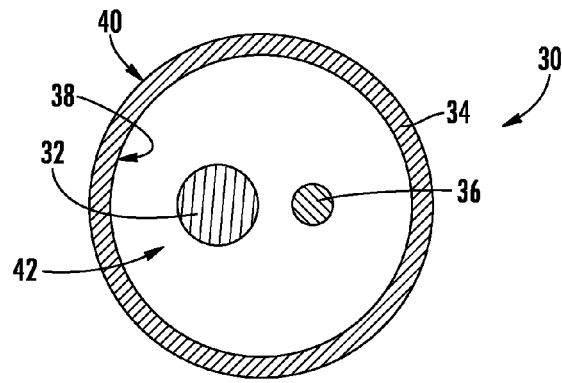
FIG. 3 is a cross-sectional view of an optical fiber cable according to an exemplary embodiment.
Figure 4:
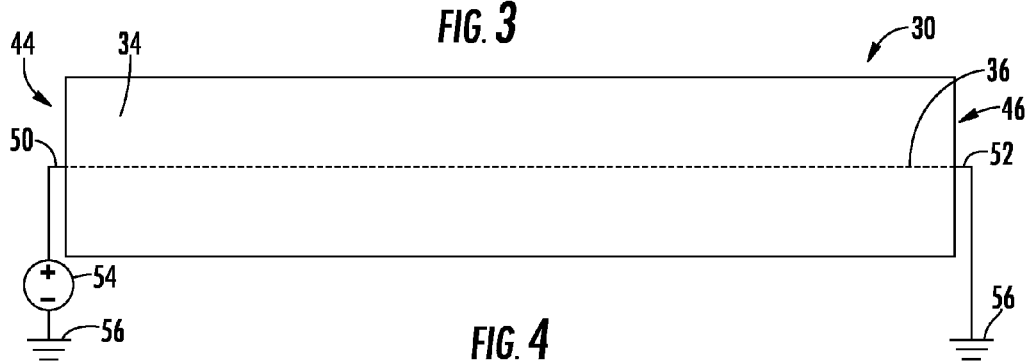
FIG. 4 is a side view of the optical fiber cable of FIG. 3 according to an exemplary embodiment.

Referring to FIG. 3 and FIG. 4, a cable, shown as fiber optic cable 30, is shown according to an exemplary embodiment. It should be understood that one or more cables 12 as shown in FIG. 1 and FIG. 2 may be configured as cable 30 discussed herein. Cable 30 includes a transmission element, shown as optical fiber 32, located within a cable body, shown as cable jacket 34. Cable 30 also includes a resistive heating element, shown as heating wire 36. In some embodiments, optical fiber 32 is a tight-buffered optical fiber having one or more outer protective layers (e.g., polymer layers) surrounding optical fiber 32, which itself comprises a glass core, a glass cladding surrounding the glass core and having a higher refractive index, and an outer coating (e.g., an acrylic layer). In other embodiments, optical fiber 32 may be one of a plurality of glass optical fibers in a loose-tube arrangement, and in other embodiments, optical fiber 32 may be one of several glass optical fibers arranged in parallel within an optical fiber ribbon. In other embodiments, optical fiber 32 may be a multi-core optical fiber. In other embodiments, a cable as disclosed herein may contain data transmission elements other than an optical fiber, such as copper wires, or other media.

Cable jacket 34 includes an inner surface 38 and an outer surface 40. Inner surface 38 defines a channel, shown as central cavity 42, and in the embodiment shown, outer surface 40 defines the exterior surface of cable 30. In the embodiment of FIG. 3, both optical fiber 32 and heating wire 36 are located in central cavity 42. In this embodiment, because heating wire 36 is located near the center of cable 30, heating wire 36 does not significantly alter the bending characteristics of cable 30.

In various embodiments, cable jacket 34 may have a thickness between 0.3 mm and 5.0 mm. In one embodiment, the outer diameter of cable jacket 34 is 2 mm. In general, cable 30 provides structure and protection to optical fiber 32 during and after installation. In one embodiment, cable jacket 34 is formed from a single layer of extruded polymer material (e.g., a medium-density polyethylene material), and in other embodiments, cable jacket 34 may include multiple layers of materials where the outermost layer defines outer surface 40 of cable jacket 34. Further, cable 30 may include one or more strengthening member embedded within the material of cable jacket 34. For example, cable 30 may include an elongate strengthening member (e.g., a fiber or rod) that runs the length of cable jacket 34 and that is formed from a material that is more rigid than the material of cable jacket 34. In various embodiments, the strengthening member is metal, braided steel, glass reinforced plastic, fiber glass, fiber glass yarns or other suitable material. In various embodiments, cable 30 may include a variety of other elements embedded in or surrounded by cable jacket 34 depending on the intended use of a particular cable 30, including armor layers, moisture barrier layers, rip cords, etc. In various embodiments, cable 30 may include other components such as steel armor and stranded and/or longitudinal strength elements. In various embodiments, cable 30 may be stranded, loose tube core cable construction, or other fiber optic cable construction.

In general, heating wire 36 is a resistive heating element configured to generate heat to increase the temperature of cable 30 in response to current flow through heating wire 36. Referring to FIG. 4, cable 30 includes a first end 44 and a second end 46, and in the embodiment shown, central cavity 42 extends the length of cable jacket 34 between first end 44 and second end 46. It should be understood that cable 30 may include a connector, such as connectors 14 shown in FIGS. 1 and 2, at first end 44 and/or second end 46 to facilitate coupling of cable 30 to hardware.

Heating wire 36 is a contiguous electrically conductive wire including a first end 50 and a second end 52, and heating wire 36 extends substantially the entire length of cable jacket 34. To enable current flow through heating wire 36, both first end 50 and second end 52 of heating wire 36 are in electrical communication with the exterior of cable 30 to allow coupling of a power source, shown as voltage source 54, and a ground connection, shown as ground 56. In other embodiments, the power source used may be a constant current power source used in place of voltage source 54. In various embodiments, either AC or DC power sources can be used to generate current within heating wire 36.

As shown schematically in FIG. 4, both first end 50 and second end 52 may physically extend from or protrude through cable jacket 34 to provide the contacts to couple voltage source 54 and ground 56 to heating wire 36. In other embodiments, first end 50 and second end 52 may be coupled to a metallic or otherwise electrically conductive component located at the respective ends of cable jacket 34. For example, in one embodiment, metallic couplers (e.g., metallic crimp bands) used to attach connectors 14 to the ends of cable jacket 34 are in contact with first end 50 and second end 52 of heating wire 36, and in this embodiment, voltage source 54 and ground 56 are coupled to heating wire 36 by coupling the respective component to the conductive portion of the connector.

In the embodiment shown, heating wire 36 is a single wire that extends the length of cable 30. In this embodiment, heating wire 36 is activated by coupling the positive terminal of voltage source 54 to first end 50 of heating wire 36 and by coupling both the negative terminal of voltage source 54 and second end 52 of heating wire 36 to ground 56. The current that flows through heating wire 36 in the arrangement shown in FIG. 4 causes resistive heating of heating wire 36. The heat generated by heating wire 36 is transferred, for example via conduction, to cable jacket 34 and to outer surface 40 of cable jacket 34. The increase in temperature is then detected allowing the user to identify and to trace the length of cable 30 (e.g., within an installation as shown FIGS. 1 and 2).

In one embodiment, when cable 30 is connected to hardware, both ends of heating wire 36 may be originally coupled to ground 56. When the user wishes to trace the length of a particular cable 30 within a network installation, the user identifies one end (either first end 44 or second end 46) of the cable 30 to be identified. The user then breaks the ground connection with heating wire 36 at the identified end, and couples voltage source 54 between the heating wire 36 and the ground. This generates a current flow through heating wire 36 causing cable jacket 34 to heat up. The user then detects the cable having the increased temperature allowing the user to follow cable 30 along its length to the other end of the cable. This allows the user to follow the length of the cable to move, replace, untangle, etc. the heated cable as may be needed. It should be understood that while FIG. 4 shows voltage source 54 coupled to first end 50 of heating wire 36, the arrangement can be reversed, depending on which end of cable 30 is identified by the user.

In various embodiments, heating wire 36 and/or the power source (e.g., voltage source 54) are configured to raise the temperature of cable jacket 34 above the ambient temperature (e.g., room temperature) of the typical network installation, and also to limit heat generation such that the temperature of cable jacket 34 does not exceed the glass transition temperature of the material of cable jacket 34. In various embodiments, heating wire 36 and/or the power source is configured to raise the temperature of cable jacket 34 by 2 degrees C. to 30 degrees C., specifically to raise the temperature of cable jacket 34 by 5 degrees C. to 15 degrees C., and more specifically to raise the temperature of cable jacket 34 by 10 degrees C. In various embodiments, heating wire 36 and/or the power source are configured to limit heating (e.g., limit current generation) such that the temperature of cable jacket 34 does not exceed 80 degrees C.

In various embodiments, heating wire 36 and/or the power source (e.g., voltage source 54) are configured to raise the temperature of cable jacket 34 by amounts discussed above in a relatively short time period. In various embodiments, heating wire 36 and/or the power source (e.g., voltage source 54) are configured to raise the temperature of cable jacket 34 to the desired temperature within 15 seconds to 90 seconds and more specifically within 30 seconds to 60 seconds.

In various embodiments, heating wire 36 is shaped and formed from a material to have resistive properties suitable for use as a heating element. In various embodiments, heating wire 36 is formed from a nickel chromium alloy (e.g., nichrome). In other embodiments, heating wire 36 is formed from a pure nickel (i.e., substantially all nickel except for impurities common in metal stock). In various embodiments, heating wire 36 is formed from a nickel material including greater than 99% nickel. In one embodiment, heating wire 36 is formed from the Nickel 200 Resistance Wire Alloy available from the Pelican Wire Company, Inc. Particularly for embodiments in which heating wire 36 is embedded in cable jacket 34 (see FIG. 5 and FIG. 8), heating wire 36 may be formed from nickel due to the flexibility of nickel that may act to limit preferential bending that may be caused by the embedded wire.

In various embodiments, heating wire 36 has a gauge or diameter to provide both suitable overall electrical resistance and flexibility. In various embodiments, heating wire 36 includes multiple (at least two) strands of thin gauge wire that may be intertwined or braided. In various embodiments, heating wire 36 may include between 1 and 10 strands of thin gauge wire, and in various embodiments, the gauge of the wire is between 42 and 32 AWG gauge wire. In a specific embodiment, heating wire 36 is formed from seven strands of 42 AWG gauge nickel wire.

In various embodiments, the diameter of heating wire 36 is between 0.04 mm and 0.4 mm, specifically is between 0.08 mm and 0.34 mm, more specifically is between 0.15 mm and 0.25 mm, and even more specifically is between 0.18 mm and 0.20 mm. In a specific embodiment, the diameter of heating wire 36 is 0.19 mm plus or minus 0.15 mm. In various embodiments, the diameter of heating wire 36 is between 3% and 18% of the outer diameter of cable jacket 34, and more specifically is between 9% and 10% of the outer diameter of cable jacket 34. In some such embodiments, the outer diameter of cable jacket 34 may be about 2 mm. In various embodiments, heating wire 36 has a resistance per unit length to provide sufficient heating while also maintaining flexibility. In various embodiments, heating wire 36 has a resistance of between 0.5 ohms/foot and 3.0 ohms/foot, specifically between 0.75 ohms/foot and 2.0 ohms/foot, and more specifically about 1.25 ohms/foot.

As will be understood, the power source used to drive heating wire 36 may be configured to allow for appropriate heating as needed for a configuration of heating wire 36. In one embodiment, the power source is a constant current power source configured to deliver a constant current less than or equal to 1 amp, and in another embodiment, the power source is a constant current power source configured to deliver a constant current less than or equal to 10 amps. In various embodiments, the power source is configured have a voltage less than 300 volts, and more specifically less than 200 volts.

In one embodiment, the user uses an infra-red sensitive device (e.g., infra-red camera or goggles) to trace the cable with the increased temperature. In another embodiment, cable jacket 34 includes a thermochromic material (e.g., a thermochromic dye or pigment) that creates a visual spectrum change in cable jacket 34 allowing the user to detect the cable 30 that has the increased temperature without the aid of an infrared sensitive device. In one embodiment, the thermochromic pigment is added to the material of cable jacket 34, and in another embodiment, a thermochromic paint is applied to outer surface 40 of cable jacket 34. In one such embodiment, the thermochromic pigment is added to a flame retardant paint applied to outer surface 40 of cable jacket 34. In such embodiments, the thermochromic pigment has a first appearance (e.g., a first color, opaque, translucent, etc.) at normal operating temperatures (e.g., room temperature) and has a second appearance (e.g., a first color, opaque, translucent, etc.) when the temperature is above an activation temperature of the pigment. In various embodiments, the thermochromic pigment has an activation temperature between 10 degrees C. and 69 degrees C., and more specifically is between 15 degrees C. and 45 degrees C. In various embodiments, the thermochromic pigment may be a first color below the activation temperature and may be translucent/transparent above the activation temperature. In such embodiments, the underlying color of the cable jacket may be exposed when the cable jacket is raised above the activation temperature.

In one embodiment, the power source (e.g., voltage source 54 or current source 74) may be a portable tool including a power source such as a battery that the user couples to cable 30 as needed to trace the length of the cable 30. In other embodiments, the hardware may be configured to activate heating wire 36 without use of a portable power source. In such embodiments, the hardware that cable 30 is coupled to may include the appropriate connections, switches and power sources to allow a user to activate the heating element of selected cable 30 by toggling a switch at the hardware or through control from a computer terminal coupled to the associated hardware.

Figure 5:
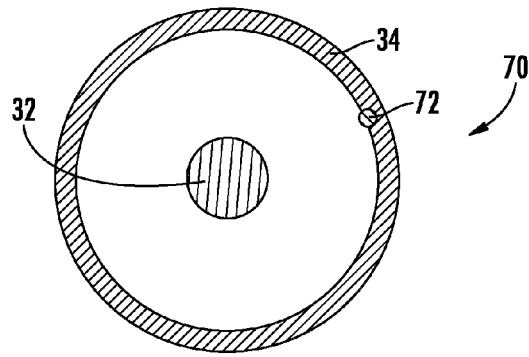
FIG. 5 is a cross-sectional view of an optical fiber cable according to another exemplary embodiment.

Referring to FIG. 5, a cable 70 is shown according to an exemplary embodiment. Cable 70 is substantially the same as cable 30 except that cable 70 includes a resistive heating element, shown as heating wire 72, that is embedded in the material of cable jacket 34. Cable 70 may include heating wire 72 in place of or in addition to heating wire 36 discussed above. Heating wire 72 operates like heating wire 36 discussed above to raise the temperature of cable 70 except that because heating wire 72 is located within cable jacket 34 and therefore is closer to outer surface 40 than heating wire 36, heating wire 72 is configured to generate less heat than heating wire 36 to allow detection of increased temperature and identification of cable 70 within a network installation. In one embodiment, the material of cable jacket 34 is extruded over heating wire 72 such that heating wire 72 is embedded within the material of cable jacket 34.

Figure 6:
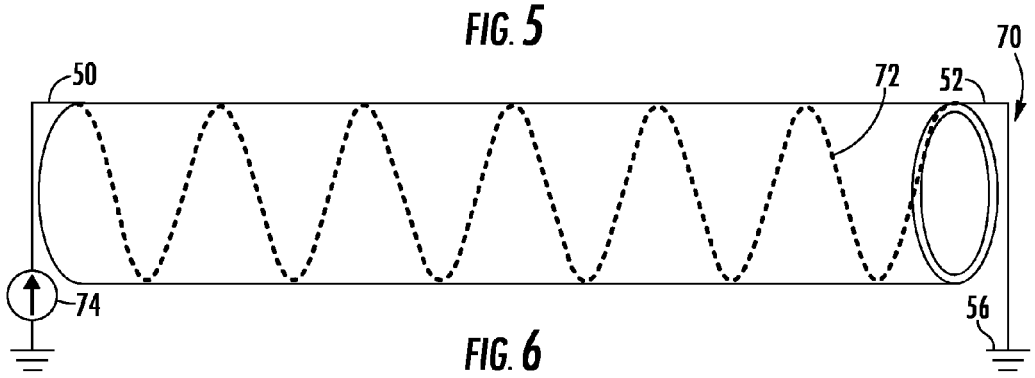
FIG. 6 is side view of the optical fiber cable of FIG. 5 according to an exemplary embodiment.

As shown in FIG. 6, heating wire 72 is embedded in material of cable jacket 34 in a helical arrangement. The helical arrangement of wire 72 allows heat generated during activation of heating wire 72 to be evenly distributed to the outer surface of cable jacket 34. The even distribution of heat facilitates detection of the selected cable from all viewing angles. In addition, the helical arrangement of heating wire 72 may provide a cable that is more flexible than if the heating wire 72 extended in a substantially straight path along cable 70.

Similar to heating wire 36, heating wire 72 includes a first end 50 and a second end 52. In various embodiments, the power source that causes heating of heating wire 72 is a constant current source, shown as current source 74. In embodiments in which cable jacket 34 is a multilayer jacket or a jacket including other components (e.g., including armor layers, moisture barriers, etc.), heating wire 72 may be located within the outer most layer of the cable jacket adjacent to outer surface 40 of cable jacket 34.

Figure 7:
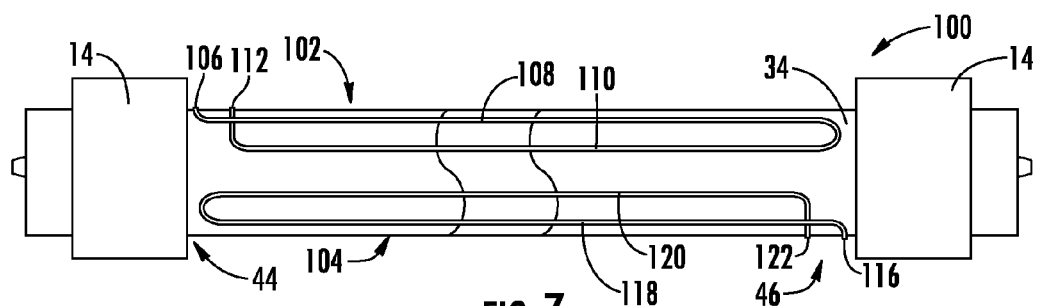
FIG. 7 is side view of an optical fiber cable of according to another exemplary embodiment.
Figure 8:
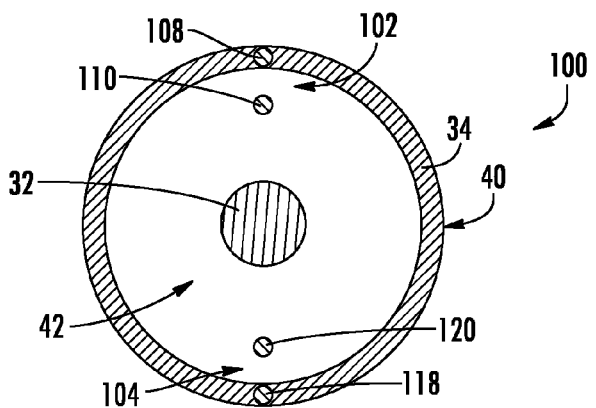
FIG. 8 is a cross-sectional view of the optical fiber cable of FIG. 7 according to an exemplary embodiment.

Referring to FIGS. 7 and 8, a cable 100 is shown according to an exemplary embodiment. Cable 100 is substantially the same as cable 30 except that cable 100 includes a first resistive heating element, shown as first heating wire 102, and a second resistive heating element, shown as second heating wire 104. Cable 100 includes connectors 14 located at both first end 44 and second end 46 of cable 100.

First heating wire 102 is a contiguous wire that includes a first end 106 and a first section, shown as outer section 108, that extends from first end 106 toward second end 46 of cable 100. First heating wire 102 includes a second section, shown as inner section 110, that extends from second end 46 of cable 100 toward second end 112 of wire 102. Inner section 110 is integral with outer section 108 such that first heating wire 102 forms a current loop when a power source is coupled between first end 106 and second end 112 of wire 102. As shown, both first end 106 and second end 112 are located at first end 44 of cable 100. Thus, with both ends of first heating wire 102 located at the same end of cable 100, the user only needs to access first end 44 of cable 100 to complete the circuit to activate first heating wire 102.

Second heating wire 104 is a contiguous wire that includes a first end 116 and a first section, shown as outer section 118, that extends from first end 116 toward first end 44 of cable 100. Second heating wire 104 includes a second section, shown as inner section 120, that extends from first end 44 of cable 100 toward second end 122 of wire 104. Inner section 120 is integral with outer section 118 such that second heating wire 104 forms a current loop when a power source is coupled between first end 116 and second end 122 of wire 102. As shown, both first end 116 and second end 122 are located at second end 46 of cable 100. Thus, with both ends of second heating wire 104 located at the same end of cable 100, the user only needs to access second end 46 of cable 100 to complete the circuit to activate second heating wire 104.

In some network installations, the user may not be able to identify both ends of a particular cable 100. Thus, cable 100 allows activation of a heating element of cable 100 from either end, which may be advantageous in situations in which the user is not able to identify both ends of a particular cable. As shown, end 106 and end 112 of heating wire 102 extends from cable jacket 34 at first end 44 of cable 100 such that electrical connection can be made to wire 102 with a power source to cause heating. End 116 and end 122 of heating wire 104 extends from cable jacket 34 at second end 46 of cable 100 such that electrical connection can be made to wire 104 with a power source to cause heating.

As shown in FIG. 8, outer segments 108 and 118 of heating wires 102 and 104 respectively, are embedded in the material of cable jacket 34. Similar to heating wire 72 discussed above, location of outer segments 108 and 118 in cable jacket 34 near outer surface 40 allows for faster heating of cable jacket 34. In addition, inner segments 110 and 120 are located radially inside of outer segments 108 and 118, respectively, and in the embodiment shown, inner segments 110 and 120 are located in central cavity 42. As shown, wire 102 is positioned about 180 degrees from wire 104. This arrangement provides flexibility to cable 100 while limiting or reducing preferential bending characteristics that may result from embedding of a wire within cable jacket 34.

Figure 9:
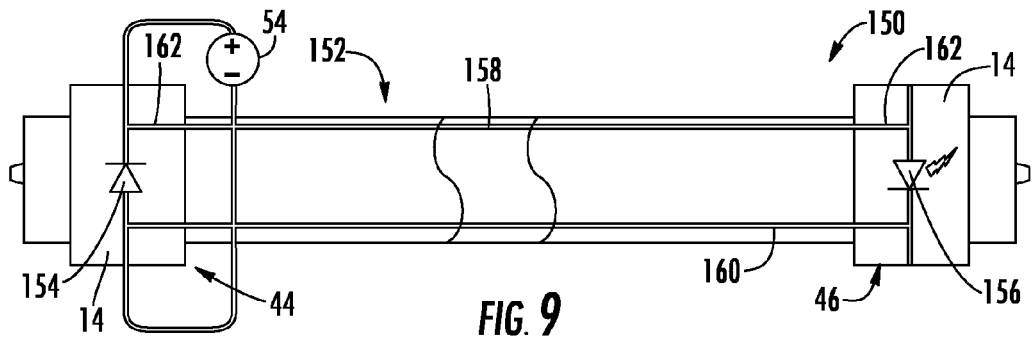
FIG. 9 is a side view of an optical fiber cable of according to another exemplary embodiment.

Referring to FIG. 9, a cable 150 is shown according to an exemplary embodiment. Cable 150 is substantially the same as cable 30 except that cable 150 includes a two wire resistive heating element 152 and cable end indicators, shown as first LED 154 and second LED 156. In this embodiment, resistive heating element 152 includes a first wire 158 and second wire 160. First wire 158 and second wire 160 are electrically coupled by connector wires 162 located within connectors 14. Similar to the other heating element embodiments discussed herein, when a power source, shown as voltage source 54, is coupled to resistive heating element 152 as shown in FIG. 9, resistive heating element 152 generates heat allowing the user to trace the body of cable 150.

In addition to allow the tracing of the body of cable 150, cable 150 facilitates the identification of the connectors at the ends of cable 150. As shown, first wire 158 is electrically coupled to the cathode of LED 154 and to the anode of LED 156. Second wire 160 is electrically coupled to the cathode of LED 156 and the anode of LED 154. Thus, when voltage source 54 is coupled to connector 14 at first end 44 of cable 150 as shown in FIG. 9, LED 156 lights up. Thus, the user is able to trace the length of cable 150 by the heating of the cable jacket and is able to identify the connector at second end 46 of cable 150 by the illuminated LED 156. When voltage source 54 is coupled to connector 14 at second end 46 of cable 150, LED 154 lights up allowing identification of the connector at first end 44.

In one embodiment, first wire 158 and second wire 160 are substantially straight wires located in the lumen of cable 150. In another embodiment, first wire 158 and second wire 160 are substantially straight wires embedded in the material of cable jacket 34. In such embodiments, first wire 158 and second wire 160 may be spaced 180 degrees apart similar to the embodiment shown in FIG. 8. In another embodiment, first wire 158 and second wire 160 are both helical wires embedded in the material of cable jacket 34 similar to the embodiment of FIG. 6.

Figure 10:
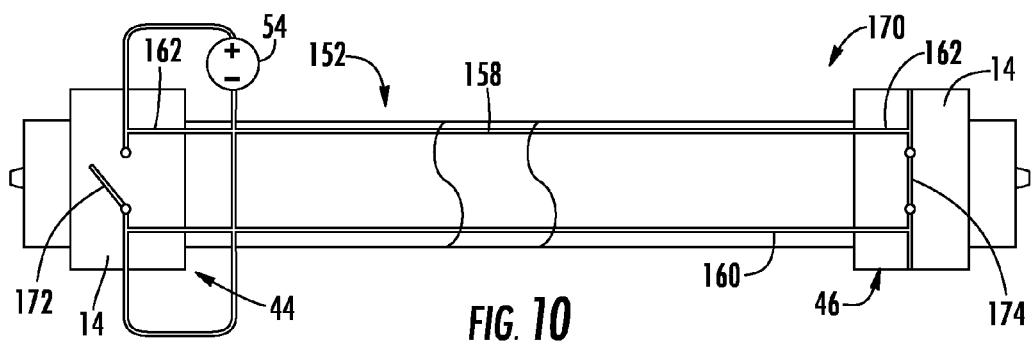
FIG. 10 is a side view of an optical fiber cable of according to another exemplary embodiment.

Referring to FIG. 10, a cable 170 is shown according to an exemplary embodiment. Cable 170 is substantially the same as cable 150 shown in FIG. 9, except that cable 170 includes switch elements, shown schematically as switch 172 and switch 174, in place of LEDs 154 and 156, respectively. In the embodiment of FIG. 10, switch 172 extends between first wire 158 and second wire 160 at first end 44 and may be located within or coupled to connector 14 at first end 44. Switch 174 extends between first wire 158 and second wire 160 at second end of 46 and may be located within or coupled to connector 14 at second end 46. In use, when one end of cable 170 is identified, the switch at the identified end is opened (e.g., switch 172 at end 44 in the example of FIG. 10), and voltage source 54 is attached between first wire 158 and second wire 160 such that a continuous current path is provided along the length of cable 170 and through closed switch 174. In general, the switch elements of cable 170 may be any circuit component that opens and closes the current path between first wire 158 and second wire 160 located at the ends of cable 170. For example, the switch elements may be manually operated switches or electrically controlled switches. In other embodiments, the switch elements may be jumper cables with clamps or clips configured to engage wires 158 and 160 to close the current path at first end 44 and second end 46.

The present disclosure also relates to a method of tracing the path of a first cable within a group of cables. The method includes the step of increasing the temperature of an outer surface of the first cable along substantially the entire length of the first cable. Following the increase in temperature, the increased temperature of the outer surface of the first cable is detected. Following the detection or tracing of the cable, the user than may move, repair, remove, disconnect, etc. the cable within the network installation as needed. In one embodiment, the detecting step includes imaging the outer surface of the first cable with an infrared imaging device. In another embodiment, the detecting step includes viewing a color change of a thermochromic material of the first cable triggered by the increased temperature of the outer surface of the first cable. In one embodiment, the increasing temperature step includes coupling a power source to a resistive heating element within the first cable.

In various embodiments, cable jackets discussed herein, e.g., cable jacket 34, may be a variety of materials used in cable manufacturing such as medium-density polyethylene, polyvinyl chloride (PVC), polyvinylidene difluoride (PVDF), nylon, polyester or polycarbonate and their copolymers. In addition, the material of cable jacket 34 may include small quantities of other materials or fillers that provide different properties to the material of cable jacket 34. For example, the material of cable jacket 34 may include materials that provide for coloring, UV/light blocking (e.g., carbon black), burn resistance, etc.

While the specific cable embodiments discussed herein and shown in the figures relate primarily to cables that have a substantially circular cross-sectional shape defining substantially cylindrical internal lumens, in other embodiments, the cables discussed herein may have any number of cross-section shapes. For example, in various embodiments, cable jacket 34 may have a square, rectangular, triangular or other polygonal cross-sectional shape. In such embodiments, the passage or lumen of the cable may be the same shape or different shape than the shape of cable jacket 34. In some embodiments, cable jacket 34 may define more than one channel or passage. In such embodiments, the multiple channels may be of the same size and shape as each other or may each have different sizes or shapes.

The optical fibers discussed herein may be flexible, transparent optical fibers made of glass or plastic. The fibers may function as a waveguide to transmit light between the two ends of the optical fiber. Optical fibers may include a transparent core surrounded by a transparent cladding material with a lower index of refraction. Light may be kept in the core by total internal reflection. Glass optical fibers may comprise silica, but some other materials such as fluorozirconate, fluoroaluminate, and chalcogenide glasses, as well as crystalline materials, such as sapphire, may be used. The light may be guided down the core of the optical fibers by an optical cladding with a lower refractive index that traps light in the core through total internal reflection. The cladding may be coated by a buffer and/or another coating(s) that protects it from moisture and/or physical damage. These coatings may be UV-cured urethane acrylate composite materials applied to the outside of the optical fiber during the drawing process. The coatings may protect the strands of glass fiber. In various embodiments, the optical fibers discussed herein are CLEARCURVE® single or multi-mode fibers produced by Corning Incorporated, or other commercially-available optical fibers.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the disclosed embodiments. For example, as will be understood by those of ordinary skill in the art, features and attributes associated with embodiments shown in one of the Figures may be applied to embodiments shown in others of the Figures. Since modifications combinations, sub-combinations and variations of the disclosed embodiments incorporating the spirit and substance of the embodiments may occur to persons skilled in the art, the disclosed embodiments should be construed to include everything within the scope of the appended claims and their equivalents.

What is claimed is:

1. An optical communication cable comprising:
   a cable body in the form of a cable jacket including a first end, a second end, an outer surface, an inner surface, and a channel defined by the inner surface and extending between the first end and the second end;
   an optical transmission element located in the channel; and
   a resistive heating element extending along at least a portion of the length of the cable body, the resistive heating element defining an electrically conductive path between first and second ends of the resistive heating element, wherein the first and second ends of the resistive heating element are in electrical communication with an exterior of the optical communication cable;
   wherein the first and second ends of the resistive heating element extend through the outer surface of the cable body, at the first end of the cable body to provide contacts for coupling to a power source;
   wherein the resistive heating element is a contiguous wire including a first section extending from the first end of the cable body toward the second end of the cable body and a second section integral with the first section and extending from the second end of the cable body toward the first end of the cable body, wherein both the first end and the second end of the resistive heating element are located at the first end of the cable body.

2. The optical communication cable of claim 1, wherein the resistive heating element is a wire having an outer diameter that is between 0.08 mm and 0.34 mm.

3. The optical communication cable of claim 1, wherein the resistive heating element is formed from a plurality of strands of nickel wire, each strand of nickel wire having a gauge between 42 and 32 AWG.

4. The optical communication cable of claim 1, further comprising a power source coupled to at least one of the first end and the second end of the resistive heating element, wherein the resistive heating element is configured to receive a current from the power source, wherein the power source is configured to deliver less than 10 amps of current and generate a voltage of less than 300 volts, wherein the resistive heating element and the power source are configured to raise the temperature of the outer surface of the cable body by 5 degrees C. to 20 degrees C.

5. The optical communication cable of claim 1, wherein at least a portion of the resistive heating element is located in the channel.

6. The optical communication cable of claim 1, wherein at least a portion of the resistive heating element is embedded in the cable body so as to be located between the inner surface and the outer surface of the cable body.

7. The optical communication cable of claim 6, wherein the portion of the resistive heating element embedded in the cable body is a helical wire.

8. The optical communication cable of claim 1, further comprising a second resistive heating element extending the length of the cable body, the second resistive heating element defining an electrically conductive path between first and second ends of the second resistive heating element, wherein the second resistive heating element is a contiguous wire including a first section extending from the second end of the cable body toward the first end of the cable body and a second section integral with the first section and extending from the first end of the cable body toward the second end of the cable body, wherein the first and second ends of the second resistive heating element are in electrical communication with the exterior of the optical communication cable, wherein both the first end and the second end of the second resistive heating element are located at the second end of the cable body.

9. The optical communication cable of claim 8, wherein the first section of the resistive heating element is embedded in the cable body and the second section of the resistive heating element is located within the channel, wherein the first section of the second resistive heating element is embedded in the cable body and the second section of the second resistive heating element is located within the channel.

10. The optical communication cable of claim 9, wherein the first section of the resistive heating element is embedded in the cable body about 180 degrees from the position at which the first section of the second resistive heating element is embedded in the cable body.

11. The optical communication cable of claim 1, further comprising a first optical connector coupled to the first end of the cable body and a second optical connector coupled to the second end of the cable body, wherein the first end of the resistive heating element is in electrical communication with a portion of the first optical connector.

12. The optical communication cable of claim 1, wherein the cable body includes a thermochromic material configured to change color in response to heat generated by the resistive heating element.

13. The optical communication cable of claim 12, wherein the thermochromic material is a thermochomic paint applied to the outer surface of the cable jacket.

14. A communication cable comprising:
    a cable body in the form of a cable jacket including a first end, a second end, an outer surface, an inner surface and a channel defined by the inner surface and extending between the first end and the second end;
    a data transmission element located in the channel; and
    a resistive heating element extending the length of the cable body, the resistive heating element defining an electrically conductive path between first and second ends of the resistive heating element, wherein the first and second ends of the resistive heating element extend through the outer surface of the cable body at the first end of the cable body or respectively at the first and second ends of the cable body to provide contacts that are in electrical communication with an exterior of the optical communication cable and are configured to be coupled to a power source to deliver current to heat the resistive heating element;

wherein at least a portion of the resistive heating element is embedded in the cable body;

wherein a second portion of the resistive heating element is located in the channel.

* * * * *